United States Patent
Sun et al.

(10) Patent No.: US 12,334,877 B2
(45) Date of Patent: Jun. 17, 2025

(54) POWER AMPLIFIER CIRCUIT, TRANSMITTER, AND NETWORK DEVICE

(71) Applicant: HUAWEI TECHNOLOGIES CO., LTD., Shenzhen (CN)

(72) Inventors: Jie Sun, Shanghai (CN); Yijun Sun, Chengdu (CN); Hailei Suo, Chengdu (CN); Jinhu Chen, Chengdu (CN); Song Li, Kista (SE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 509 days.

(21) Appl. No.: 17/695,065

(22) Filed: Mar. 15, 2022

(65) Prior Publication Data
US 2022/0200541 A1    Jun. 23, 2022

Related U.S. Application Data (63) Continuation of application No. PCT/CN2019/105943, filed on Sep. 16, 2019.

(51) Int. Cl.
*H03F 1/42* (2006.01)
*H03F 1/56* (2006.01)
*H03F 3/24* (2006.01)

(52) U.S. Cl.
CPC .............. *H03F 1/42* (2013.01); *H03F 1/56* (2013.01); *H03F 3/245* (2013.01);
(Continued)

(58) Field of Classification Search
CPC ... H03F 1/42; H03F 1/56; H03F 3/245; H03F 2200/222; H03F 2200/387
(Continued)

(56) References Cited

U.S. PATENT DOCUMENTS

| 11,888,448 B2* | 1/2024 | Pham | H03F 3/245 |
| 2004/0189380 A1* | 9/2004 | Myer | H03F 1/0266 |
| | | | 330/124 R |

(Continued)

FOREIGN PATENT DOCUMENTS

| CN | 101567665 A | 10/2009 |
| CN | 102355198 B | 11/2013 |

(Continued)

OTHER PUBLICATIONS

International Search Report issued in corresponding International Application No. PCT/CN2019/105943, dated Jun. 4, 2020, pp. 1-11.
(Continued)

*Primary Examiner* — Patricia T Nguyen
(74) *Attorney, Agent, or Firm* — HAUPTMAN HAM, LLP (57) ABSTRACT

A power amplifier circuit, a transmitter, and a network device are provided. The power amplifier circuit includes N input ports, N power amplifier branches, one combiner circuit, and one output port. Each of the N input ports is connected to one power amplifier branch, each of the power amplifier branches is connected to the combiner circuit, and the combiner circuit is further connected to the output port; the N power amplifier branches and the combiner circuit are configured to perform power amplification and combining on N input signals, to generate an output signal. The N power amplifier branches include one first power amplifier branch operates in a class AB or class B operating mode, and N−1 second power amplifier branches operate in a class C operating mode with different gate bias voltages, the gate bias voltages of the N−1 second power amplifier branches become lower in order.

20 Claims, 5 Drawing Sheets

(52) U.S. Cl.
CPC .. *H03F 2200/222* (2013.01); *H03F 2200/387* (2013.01); *H03F 2200/451* (2013.01)

(58) Field of Classification Search
USPC .......................................................... 330/295
See application file for complete search history.

(56) References Cited

U.S. PATENT DOCUMENTS

| | | | | |
|---|---|---|---|---|
| 2010/0001802 | A1* | 1/2010 | Blednov | H03F 1/0288 |
| | | | | 330/124 R |
| 2014/0159808 | A1 | 6/2014 | Acimovic et al. | |
| 2018/0076773 | A1* | 3/2018 | Lloyd | G06F 30/36 |
| 2018/0102744 | A1* | 4/2018 | Hellberg | H03F 3/191 |
| 2020/0091869 | A1* | 3/2020 | Hone | H03F 3/211 |
| 2023/0283240 | A1* | 9/2023 | Zhao | H03F 3/211 |
| | | | | 330/295 |

FOREIGN PATENT DOCUMENTS

| | | |
|---|---|---|
| CN | 104113286 A | 10/2014 |
| CN | 106357223 A | 1/2017 |
| CN | 107210710 A | 9/2017 |
| CN | 109905092 A | 6/2019 |
| CN | 209117844 U | 7/2019 |
| CN | 110214416 A | 9/2019 |
| EP | 3070840 A1 | 9/2016 |
| IN | 108011592 A | 5/2018 |
| JP | 2010118824 A | 5/2010 |
| WO | 2009081341 A1 | 7/2009 |
| WO | 2019072400 A1 | 4/2019 |
| WO | 2019091541 A1 | 5/2019 |

OTHER PUBLICATIONS

Japanese Office Action issued in corresponding Japanese Application No. 2022-516707, dated Oct. 30, 2023, pp. 1-6.
Youngoo Yang et al: "A Fully Matched N-Way Doherty Amplifier With Optimized Linearity", IEEE Transactions on Microwave Theory and Techniques, IEEE, USA, vol. 51, No. 3, Mar. 1, 2003 (Mar. 1, 2003), pp. 986-993, XP011076951.
Extended European Search Report issued in corresponding European Application No. 19945716.9, dated Aug. 3, 2022, pp. 1-10.
Chinese First Office Action issued in corresponding Chinese Application No. 201980100342.1, dated Jan. 14, 2025, pp. 1-9.

* cited by examiner

POWER AMPLIFIER CIRCUIT, TRANSMITTER, AND NETWORK DEVICE

CROSS-REFERENCE TO RELATED APPLICATIONS

This application is a continuation of International Application No. PCT/CN2019/105943, filed on Sep. 16, 2019. the disclosure of which is hereby incorporated by reference in its entirety.

BACKGROUND

With rapid development of wireless communications technologies, a wireless communications system has increasingly high demands on a channel capacity and a data transmission rate. Present and future wireless communications systems include a power amplifier to have wideband and multi-band features, so that the power amplifier covers a plurality of frequency bands in a same communications standard and needs to be compatible with different communications standards. In addition, the power amplifier operates at different operating frequency bands and needs an increasingly wide signal bandwidth. In addition, a power amplifier is a main energy consumption module of a transceiver. The energy consumption of the power amplifier accounts for a high proportion of that of a wireless communications system. An improvement of efficiency of the power amplifier for reducing the energy consumption directly affects heat dissipation of the system, and also affects a loading capacity of a power supply. Therefore, to extend an operating bandwidth of the power amplifier and improve work efficiency of the power amplifier is a beneficial technology for the wireless communications system.

Two-way Doherty (DHT), based on an active load modulation mechanism, has been widely applied to mobile base stations, to effectively improve back-off efficiency of a power amplifier circuit. Three-way, four-way, or N-way DHT may further extend a power back-off or generate a plurality of high efficiency points, to further improve power amplification efficiency.

However, an operating bandwidth of the N-way DHT is usually limited due to a relatively large load pull ratio of a power transistor, and the N-way DHT is unable to be used in a high-power ultra-wideband power amplifier circuit.

SUMMARY

This application provides a power amplifier circuit, a transmitter, and a network device, and the power amplifier circuit has features of a wide band and high efficiency.

According to a first aspect, an embodiment of this application provides a power amplifier circuit. The power amplifier circuit includes N input ports, N power amplifier branches, one combiner circuit, and one output port. Each of the N input ports is connected to one power amplifier branch in the N power amplifier branches, each of the power amplifier branches is connected to the combiner circuit, the combiner circuit is further connected to the output port, and each input port is configured to input one input signal. The N power amplifier branches and the combiner circuit are configured to perform power amplification and combining on N input signals, to generate an output signal. The output port is configured to output the output signal. The N power amplifier branches include one first power amplifier branch and N−1 second power amplifier branches. The first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2.

In this implementation, the first power amplifier branch operates in the class AB or class B operating mode, the N−1 second power amplifier branches operate in the class C operating mode with different gate bias voltages, and the N power amplifier branches are turned on in order and are saturated in order. Therefore, a plurality of high efficiency points can be generated with different power back-offs, and back-off efficiency is improved. In addition, because there is no load pull between the N power amplifier branches, a load pull ratio is 1. Therefore, an operating bandwidth of the power amplifier circuit of this application can be guaranteed, thereby making the power amplifier circuit feature a wide band and high efficiency.

In a possible design, each of the second power amplifier branches includes one first port and two second ports. The first port is connected to one input port, and the two second ports are separately connected to the combiner circuit. Each of the second power amplifier branches is configured to perform power allocation and power amplification on one of the input signals, to generate two second signals, and each of the two second signals is output to the combiner circuit through one of the second ports Amplitudes of the two second signals are the same, and a phase difference is 90 degrees.

In this implementation, the second power amplifier branches can implement a characteristic of balanced power amplification.

In a possible design, each of the second power amplifier branches includes one power allocation circuit and two power amplifier sub-branches. A through port and a coupling port of the power allocation circuit each are connected to one of the power amplifier sub-branches. The two power amplifier sub-branches operate in a class C operating mode with a same bias.

In this implementation, there is no load pull between the first power amplifier branch and each of the second power amplifier branches, and therefore, a load pull ratio is 1. This can guarantee a bandwidth of the power amplifier circuit of this application and avoid a bandwidth limit.

In a possible design, the combiner circuit includes N−1 couplers and N−1 impedance matching circuits. One impedance matching circuit is disposed between two adjacent couplers in the N−1 couplers, and one impedance matching circuit is disposed between the output port of the power amplifier circuit and one coupler. An isolated port of a first coupler in the N−1 couplers is connected to an output port of the first power amplifier branch, and two balance ports of each of the N−1 couplers each are connected to one of the second power amplifier branches.

In a possible design, the impedance matching circuit between the two adjacent couplers is configured to convert a characteristic impedance of a former coupler in the two adjacent couplers to a characteristic impedance of a latter coupler in the two adjacent couplers.

In a possible design, a characteristic impedance of each of the N−1 couplers is determined based on optimal impedances of power transistors of the first power amplifier branch and the second power amplifier branches that operate in the class B operating mode.

In this implementation, a characteristic impedance of a coupler in the combiner circuit can be determined based on an optimal impedance of a power transistor of a power amplifier branch, which can improve performance of the power amplifier circuit of this application.

In a possible design, the impedance matching circuit includes at least one of a low-pass filter circuit, a high-pass filter circuit, a resonant circuit, or a microstrip line.

In a possible design, the first power amplifier branch includes a power amplifier.

In a possible design, the first power amplifier branch includes a Doherty circuit, an input port of the Doherty circuit is connected to an input port of the power amplifier circuit, and an output port of the Doherty circuit is connected to the combiner circuit.

In a possible design, the first power amplifier branch reaches a state of voltage saturation and current saturation before the second power amplifier branches reach a state of voltage saturation and current saturation.

According to a second aspect, an embodiment of this application provides a transmitter, including the power amplifier circuit according to any implementation of the first aspect.

According to a third aspect, an embodiment of this application provides a network device. The network device includes a transceiver, a processor, and a memory, and the transceiver includes the power amplifier circuit according to any one of the first aspect.

This application provides the power amplifier circuit, the transmitter, and the network device. The power amplifier circuit includes N input ports, N power amplifier branches, one combiner circuit, and one output port. Each of the N input ports is connected to one power amplifier branch in the N power amplifier branches, each of the power amplifier branches is connected to the combiner circuit, and the combiner circuit is further connected to the output port; each of the input ports is configured to input one input signal; the N power amplifier branches and the combiner circuit are configured to perform power amplification and combining on N input signals, to generate an output signal; and the output port is configured to output the output signal. The N power amplifier branches include one first power amplifier branch and N−1 second power amplifier branches, the first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2. Because the N power amplifier branches are turned on in order, and are saturated in order, a plurality of high efficiency points can be generated with different power back-offs, and back-off efficiency is improved. In addition, because there is no load pull between the N power amplifier branches, a load pull ratio is 1. Therefore, an operating bandwidth of the power amplifier circuit of this application can be guaranteed, and the power amplifier circuit has features of a wide band and high efficiency.

DESCRIPTION OF EMBODIMENTS

The terms "first", "second", and the like in this application are for descriptive purposes and not construed as indicating or implying relative significance or be construed as indicating or implying a sequence. Moreover, the terms "include", "have", and any other variant thereof are intended to cover a non-exclusive inclusion, for example, including a series of steps or units. Methods, systems, products, or devices are not necessarily limited to those explicitly listed steps or units, but may include other steps or units that are not explicitly listed or that are inherent to such processes, methods, products, or devices. In the descriptions of the embodiments of this application, the word such as "example" or "for example" is used to represent giving an example, an illustration, or a description. Any embodiment or design scheme described as "in an example" or "for example" in the embodiments of this application is not explained as being more preferred or having more advantages than another embodiment or design scheme. Use of the word "example" or "for example" or the like is intended to present a relative concept in a clear manner.

In this application, "at least one (piece)" means one or more, and "a plurality of" means two or more. The term "and/or" is used to describe an association relationship between associated objects and indicates that three relationships may exist. For example, "A and/or B" may indicate the following three cases: A exists, B exists, and both A and B exist, where A and B may be singular or plural. The character "/" usually indicates an "or" relationship between the associated objects. "At least one (piece) of the following" or a similar expression thereof indicates any combination of the following, including any combination of one or more of the following. For example, at least one (piece) of a, b, or c may represent: a, b, c, "a and b", "a and c", "b and c", or "a, b, and c", where a, b, and c may be singular or plural.

An embodiment of this application provides a power amplifier circuit. The power amplifier circuit has features of a wide band and high efficiency, can generate a plurality of high efficiency points with different power back-offs to improve back-off efficiency, and can guarantee that a load pull ratio of each power transistor is 1. For a structure of the power amplifier circuit, refer to the following descriptions in this embodiment.

Figure 1:
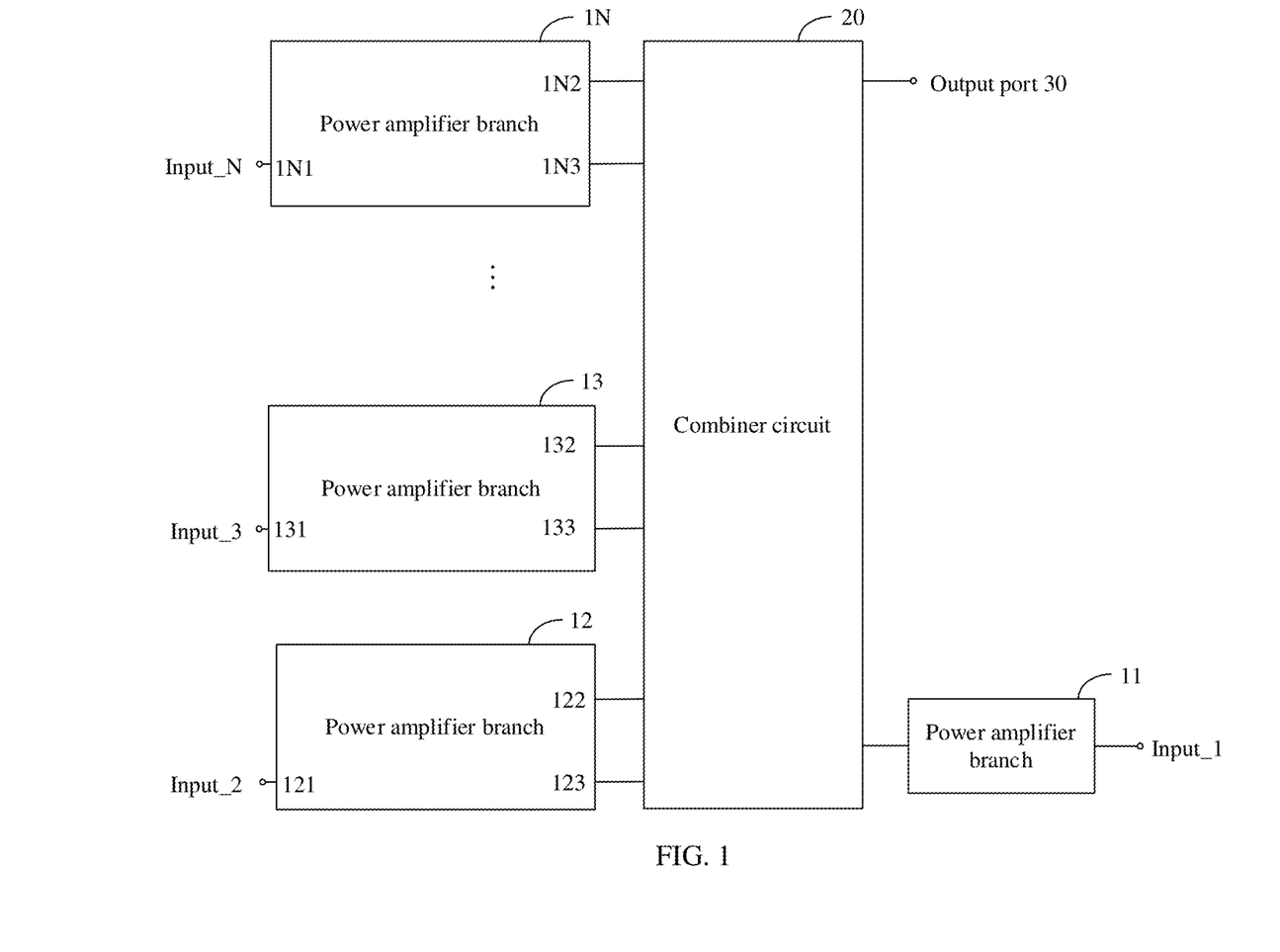
FIG. 1 is a schematic diagram of a structure of a power amplifier circuit according to an embodiment of this application.

FIG. 1 is a schematic diagram of a structure of a power amplifier circuit according to an embodiment of this application. As shown in FIG. 1, the power amplifier circuit may include N input ports, N power amplifier branches, one combiner circuit 20, and one output port 30.

The N input ports are input_1, input_2, input_3, . . . , and input_N. The N power amplifier branches are a power amplifier branch 11, a power amplifier branch 12, . . . , and a power amplifier branch 1N.

Each of the N input ports is connected to one power amplifier branch in the N power amplifier branches, each of the power amplifier branches is connected to the combiner circuit 20, and the combiner circuit 20 is further connected to the output port. For example, as shown in FIG. 1, input_1 is connected to the power amplifier branch 11, input_2 is connected to the power amplifier branch 12, input_3 is connected to a power amplifier branch 13, and on the analogy of this, input_N is connected to the power amplifier branch 1N. An output port of each power amplifier circuit is connected to an input port of the combiner circuit 20, and an output port of the combiner circuit is connected to the output port 30.

Each input port (input_1, input_2, input_3, . . . , and input_N) is configured to input one input signal. The N power amplifier branches and the combiner circuit 20 are configured to perform power amplification and combining on N input signals, to generate an output signal. The output port 30 is configured to output the output signal.

The N power amplifier branches include one first power amplifier branch and N−1 second power amplifier branches, where the first power amplifier branch operates in a class AB (AB) or class B (B) operating mode, the N−1 second power amplifier branches operate in a class C (C) operating mode with different gate bias voltages, the gate bias voltages of the N−1 second power amplifier branches become lower in order, and N is a positive integer greater than 2. That is, as shown in FIG. 1, the power amplifier branch 11 is the first power amplifier branch, and the power amplifier branch 12, the power amplifier branch 13, . . . , and the power amplifier branch 1N are the N−1 second power amplifier branches, where gate bias voltages of the power amplifier branch 12, the power amplifier branch 13, . . . , and the power amplifier branch 1N become lower in order.

In some embodiments, the first power amplifier branch (the power amplifier branch 11) includes one input port and one output port, where the input port of the power amplifier branch 11 is connected to input_1, and the output port of the power amplifier branch 11 is connected to the input port of the combiner circuit 20.

In some embodiments, each of the second power amplifier branches (the power amplifier branch 12, the power amplifier branch 13, . . . , and the power amplifier branch 1N) includes one first port and two second ports, where the first port is connected to one input port, and the two second ports are separately connected to the combiner circuit 20. Each of the second power amplifier branches (the power amplifier branch 12, the power amplifier branch 13, . . . , and the power amplifier branch 1N) is configured to perform power allocation and power amplification on one input signal, to generate two second signals, and each of the two second signals is output to the combiner circuit 20 through one of the second ports. Amplitudes of the two second signals are the same, and a phase difference is 90 degrees.

For example, the power amplifier branch 12 includes one first port 121 and two second ports (122 and 123), where the first port 121 is connected to input_2, and the second port 122 and the second port 123 are separately connected to the combiner circuit 20. The power amplifier branch 12 is configured to perform power allocation and power amplification on an input signal input through input_2, to generate two second signals, and the two second signals are output to the combiner circuit 20 through the second port 122 and the second port 123. The power amplifier branch 13 includes one first port 131 and two second ports (132 and 133), where the first port 131 is connected to input_3, and the second port 132 and the second port 133 are separately connected to the combiner circuit 20. The power amplifier branch 13 is configured to perform power allocation and power amplification on an input signal input through input_3, to generate two second signals, and the two second signals are output to the combiner circuit 20 through the second port 132 and the second port 133. The power amplifier branch 1N includes one first port 1N1 and two second ports (1N2 and 1N3), where the first port 1N1 is connected to input_N, and the second port 1N2 and the second port 1N3 are separately connected to the combiner circuit 20. The power amplifier branch 1N is configured to perform power allocation and power amplification on an input signal input through input_N, to generate two second signals, and the two second signals are output to the combiner circuit 20 through the second port 1N2 and the second port 1N3. A connection manner of another second power amplifier branch is the same as that of the power amplifier branch 12, the power amplifier branch 13, or the power amplifier branch 1N. Illustrations are not provided herein.

The combiner circuit 20 is configured to perform power combining of output signals from the output port of the power amplifier branch 11, the second port 122, the second port 123, the second port 132, the second port 133, . . . , the second port 1N2, and the second port 1N3, and perform outputting through the output port 30.

An operating principle of the power amplifier circuit in this embodiment of this application is described illustratively. The power amplifier branch 11 operates in the class AB (AB) or class B (B) operating mode, the power amplifier branch 12, the power amplifier branch 13, . . . , and the power amplifier branch 1N operate in the class C operating mode, and a gate bias voltage of each of the second power amplifier branches (the power amplifier branch 12, the power amplifier branch 13, . . . , and the power amplifier branch 1N) becomes lower in order, and therefore, the power amplifier branch 11, the power amplifier branch 12, the power amplifier branch 13, . . . , and the power amplifier branch 1N are turned on in order, and are saturated in order. For example, first, the power amplifier branch 11 operates, and the power amplifier branch 12, the power amplifier branch 13, . . . , and the power amplifier branch 1N are off. After the power amplifier branch 11 is saturated, the power amplifier branch 12 is turned on, and the power amplifier branch 13, . . . , and the power amplifier branch 1N are still off, and the power amplifier branch 11 remains saturated. After the power amplifier branch 12 is saturated, the power amplifier branch 13 is turned on, and a power amplifier branch 14, . . . , and the power amplifier branch 1N are still off, and the power amplifier branch 11 and the power amplifier branch 12 remain saturated. This process goes on by analogy until various power amplifier branches (the power amplifier branch 14, . . . , and the power amplifier branch 1N) are saturated. According to the foregoing operating principle, high efficiency points are generated at different back-off points. For example, a total of N high efficiency points are generated, thereby improving power back-off efficiency and efficiency of a modulated signal.

In an implementation, the first power amplifier branch includes a power amplifier, where the power amplifier may be used as a main amplifier. In another implementation, the first power amplifier branch includes a Doherty circuit, an input port of the Doherty circuit is connected to an input port (input_1) of the power amplifier circuit, and an output port of the Doherty circuit is connected to the combiner circuit 20.

The first power amplifier branch reaches a state of voltage saturation and current saturation before the second power amplifier branches reach a state of voltage saturation and current saturation.

The power amplifier circuit of this embodiment includes N input ports, N power amplifier branches, one combiner circuit, and one output port, where each of the N input ports is connected to one power amplifier branch in the N power amplifier branches, each of the power amplifier branches is connected to the combiner circuit, and the combiner circuit is further connected to the output port; each of the input ports is configured to input one input signal; the N power amplifier branches and the combiner circuit are configured to perform power amplification and combining on N input signals, to generate an output signal; and the output port is configured to output the output signal, where the N power amplifier branches include one first power amplifier branch and N−1 second power amplifier branches, the first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2. Because the N power amplifier branches are turned on in order, and are saturated in order, a plurality of high efficiency points can be generated with different power back-offs, and back-off efficiency is improved. In addition, because there is no load pull between the N power amplifier branches, a load pull ratio is 1, and therefore, an operating bandwidth of the power amplifier circuit of this application can be guaranteed, and the power amplifier circuit has features of a wide band and high efficiency.

M input ports of the power amplifier circuit in this embodiment of this application may be connected to an output port of one power allocation circuit. M of the N input signals (M is less than or equal to N) in this embodiment of this application may be M output signals from the power allocation circuit. For example, signals that are sent are two channel signals, N=3, and M=2. In this case, one channel signal may be input into one input port of the power amplifier circuit in this embodiment of this application, and the other channel signal may be input into the power allocation circuit, where the power allocation circuit splits the channel signal into two sub-channel signals, and the two sub-channel signals may be input into other two input ports of the power amplifier circuit in this embodiment of this application.

Figure 2:
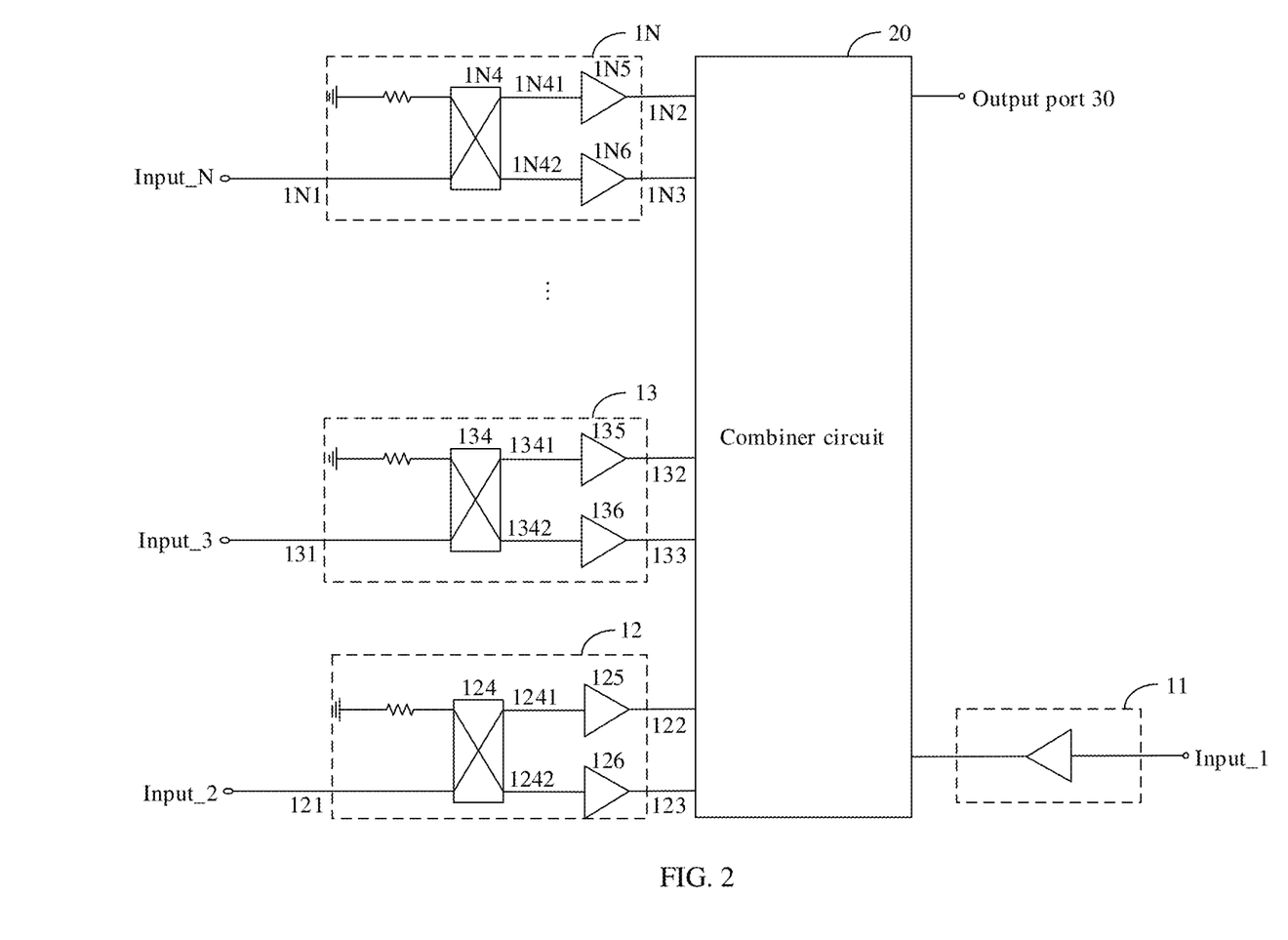
FIG. 2 is a schematic diagram of a structure of another power amplifier circuit according to an embodiment of this application.

FIG. 2 is a schematic diagram of a structure of another power amplifier circuit according to an embodiment of this application. As shown in FIG. 2, based on the power amplifier circuit shown in FIG. 1, in this embodiment, each of the second power amplifier branches (the power amplifier circuit 12, the power amplifier circuit 13, . . . , and the power amplifier circuit 1N) may include one power allocation circuit and two power amplifier sub-branches. A through port and a coupling port of the power allocation circuit each are connected to one of the power amplifier sub-branches, where the two power amplifier sub-branches operate in the class C (C) operating mode with a same bias.

Each power allocation circuit is configured to perform power allocation on an input signal of an input port (input_2, input_3, . . . , or input_N). For example, each power allocation circuit may be a coupler such as a 50-ohm coupler. Each of the power amplifier sub-branches is configured to perform power amplification, and may be a power amplifier.

For example, the power amplifier branch 12 may include a power allocation circuit 124, a power amplifier sub-branch 125, and a power amplifier sub-branch 126, where an input port of the power allocation circuit 124 is connected to input_2, and an isolated port of the power allocation circuit 124 is connected to a load. A through port 1241 of the power allocation circuit 124 is connected to an input port of the power amplifier sub-branch 125, and a coupling port 1242 of the power allocation circuit 124 is connected to an input port of the power amplifier sub-branch 126. An output port of the power amplifier sub-branch 125 is connected to the second port 122, and an output port of the power amplifier sub-branch 126 is connected to the second port 123. The power amplifier sub-branch 125 and the power amplifier sub-branch 126 may be two power amplifiers operating in the class C (C) operating mode with a same gate bias voltage, and the power amplifiers may be peaking amplifiers 1.

An input signal input into input_2 is split into two signals through the power allocation circuit 124, where one of the two signals is output to the power amplifier sub-branch 125 through the through port 1241, and the other signal is output to the power amplifier sub-branch 126 through the coupling port 1242. A phase difference between the two signals is 90 degrees. The two signals are output from the power amplifier sub-branch 125 and the power amplifier sub-branch 126 to be two second signals, where amplitudes of the two second signals are the same, and a phase difference is 90 degrees.

For example, the power amplifier branch 13 may include a power allocation circuit 134, a power amplifier sub-branch 135, and a power amplifier sub-branch 136, where an input port of the power allocation circuit 134 is connected to input_3, and an isolated port of the power allocation circuit 134 is connected to a load. A through port 1341 of the power allocation circuit 134 is connected to an input port of the power amplifier sub-branch 135, and a coupling port 1342 of the power allocation circuit 134 is connected to an input port of the power amplifier sub-branch 136. An output port of the power amplifier sub-branch 135 is connected to the second port 132, and an output port of the power amplifier sub-branch 136 is connected to the second port 133. The power amplifier sub-branch 135 and the power amplifier sub-branch 136 may be two power amplifiers operating in the class C (C) operating mode with a same gate bias voltage, and the power amplifiers may be peaking amplifiers 2.

An input signal input into input_3 is split into two signals through the power allocation circuit 134, where one of the two signals is output to the power amplifier sub-branch 135 through the through port 1341, and the other signal is output to the power amplifier sub-branch 136 through the coupling port 1342. A phase difference between the two signals is 90 degrees. The two signals are output from the power amplifier sub-branch 135 and the power amplifier sub-branch 136 to be two second signals, where amplitudes of the two second signals are the same, and a phase difference is 90 degrees.

For example, the power amplifier branch 1N may include a power allocation circuit 1N4, a power amplifier sub-branch 1N5, and a power amplifier sub-branch 1N6, where an input port of the power allocation circuit 1N4 is connected to input_N, and an isolated port of the power allocation circuit 1N4 is connected to a load. A through port 1N41 of the power allocation circuit 1N4 is connected to an input port of the power amplifier sub-branch 1N5, and a coupling port 1N42 of the power allocation circuit 1N4 is connected to an input port of the power amplifier sub-branch 1N6. An output port of the power amplifier sub-branch 1N5 is connected to the second port 1N2, and an output port of the power amplifier sub-branch 1N6 is connected to the second port 1N3. The power amplifier sub-branch 1N5 and the power amplifier sub-branch 1N6 may be two power amplifiers operating in the class C (C) operating mode with a same gate bias voltage, and the power amplifiers may be peaking amplifiers (N−1).

An input signal input into input_N is split into two signals through the power allocation circuit 1N4, where one of the two signals is output to the power amplifier sub-branch 1N5 through the through port 1N41, and the other signal is output to the power amplifier sub-branch 1N6 through the coupling port 1N42. A phase difference between the two signals is 90 degrees. The two signals are output from the power amplifier sub-branch 1N5 and the power amplifier sub-branch 1N6 to be two second signals, where amplitudes of the two second signals are the same, and a phase difference is 90 degrees.

Another second power amplifier branch uses a similar connection manner. Illustrations are not provided herein.

The combiner circuit 20 is configured to perform power combining on a signal output from the first power amplifier branch and two second signals output from any second power amplifier branch in the N−1 second power amplifier branches. By using the connection manner of each of the foregoing second power amplifier branches and the combiner circuit, a characteristic of balanced power amplification can be implemented.

In this embodiment, there is no load pull between the first power amplifier branch and each of the second power amplifier branches, and therefore, a load pull ratio is 1, which can guarantee a bandwidth of the power amplifier circuit of this application and avoid a bandwidth limit.

Figure 3:
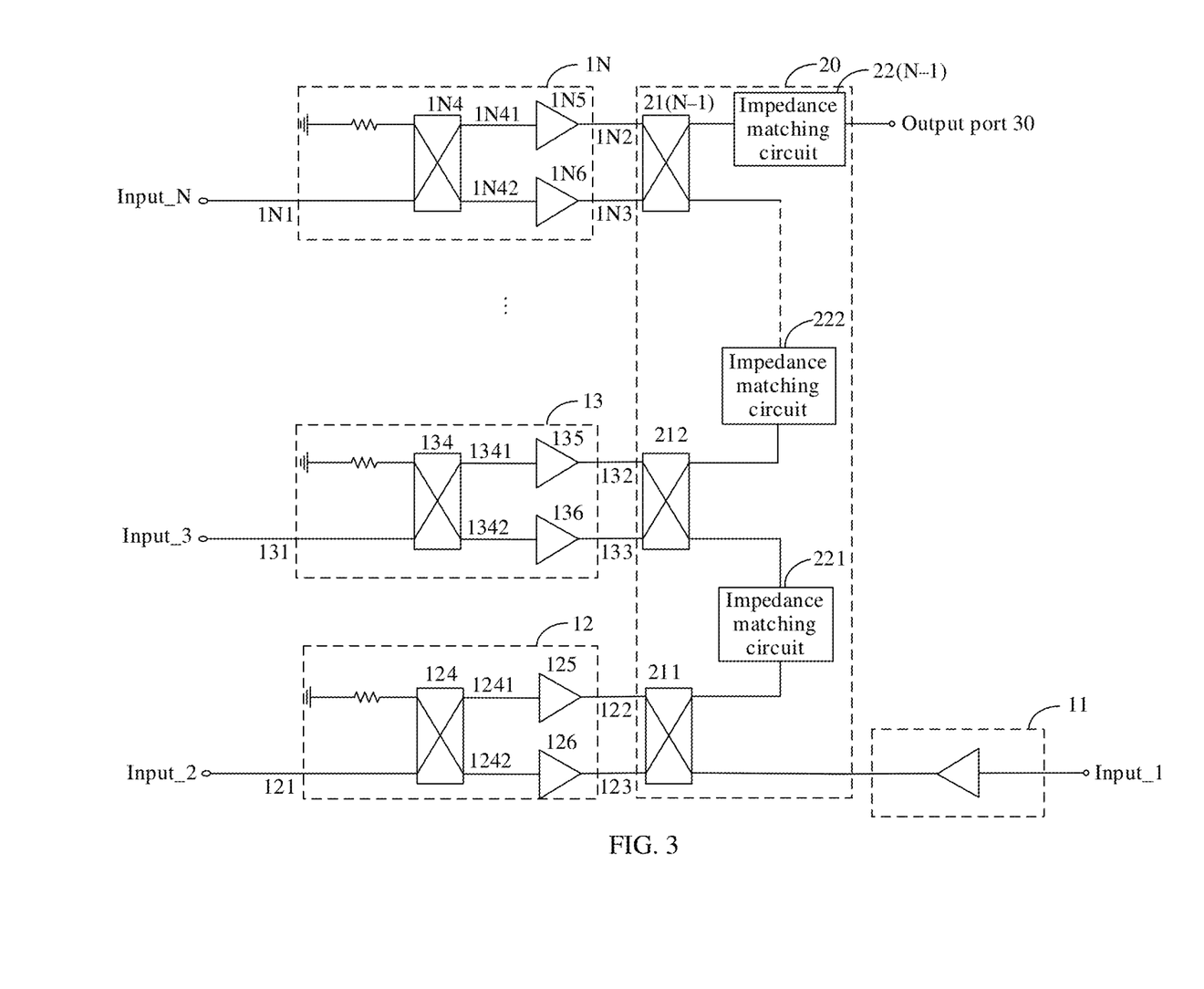
FIG. 3 is a schematic diagram of a structure of another power amplifier circuit according to an embodiment of this application.

FIG. 3 is a schematic diagram of a structure of another power amplifier circuit according to an embodiment of this application. As shown in FIG. 3, based on the power amplifier circuit shown in FIG. 1 and FIG. 2, in this embodiment, the combiner circuit 20 may include N−1 couplers (211, 212, ..., and 21(N−1)) and N−1 impedance matching circuits (221, 222, ..., and 22(N−1)). One impedance matching circuit is disposed between two adjacent couplers in the N−1 couplers, and one impedance matching circuit is disposed between the output port of the power amplifier circuit and one coupler. An isolated port of a first coupler in the N−1 couplers is connected to an output port of the first power amplifier branch, and two balance ports of each of the N−1 couplers each are connected to one of the second power amplifier branches.

Refer to FIG. 3. A connection structure of the coupler is described. An isolated port of the coupler 211 is connected to the output port of the power amplifier branch 11, one of two balance ports of the coupler 211 is connected to the second port 122 of the power amplifier branch 12, and the other of the two balance ports of the coupler 211 is connected to the second port 123 of the power amplifier branch 12. An output port of the coupler 211 is connected to an isolated port of the coupler 212 by using the impedance matching circuit 221.

One of two balance ports of the coupler 212 is connected to the second port 132 of the power amplifier branch 13, and the other of the two balance ports of the coupler 212 is connected to the second port 133 of the power amplifier branch 13. An output port of the coupler 212 is connected to an isolated port of the coupler 213 by using the impedance matching circuit 222.

On the analogy of this, one of two balance ports of the coupler 21(N−1) is connected to the second port 1N2 of the power amplifier branch 1N, and the other of the two balance ports of the coupler 21(N−1) is connected to the second port 1N3 of the power amplifier branch 1N. An output port of the coupler 21(N−1) is connected to an isolated port of the coupler 30 by using the impedance matching circuit 22(N−1).

The coupler 211 is configured to perform power combining on a signal output from the power amplifier branch 11 and two second signals output from the power amplifier branch 12. The coupler 212 is configured to perform power combining on a signal input into the isolated port of the coupler 212 and two second signals from the power amplifier branch 13, ..., and the coupler 21(N−1) is configured to perform power combining on a signal input into an isolated port of the coupler 21(N−1) and two second signals from the power amplifier branch 1N. Because a signal input into the isolated port of the coupler 212 is a signal output after power combining by the coupler 211 on the signal output from the power amplifier branch 11 and the two second signals output from the power amplifier branch 12, in other words, the coupler 212 is configured to perform power combining on the signal from the power amplifier branch 11, signals from the power amplifier branch 12, and a signal from the power amplifier branch 13. The coupler 21(N−1) is configured to perform power combining on the signal from the power amplifier branch 11, the signals from the power amplifier branch 12, and signals from the power amplifier branch 13, ..., and the power amplifier branch 1N.

In some embodiments, the impedance matching circuit between the two adjacent couplers is configured to convert a characteristic impedance of a former coupler in the two adjacent couplers to a characteristic impedance of a latter coupler in the two adjacent couplers.

A characteristic impedance of the foregoing couplers (211, 212, ..., and 21(N−1)) may be $Z_{01}$, $Z_{02}$, and $Z_{0n-1}$ respectively. The power amplifier branch 11 is connected to the isolated port of the coupler 211 with a characteristic impedance $Z_{01}$. The impedance matching circuit 221 is configured to implement matching from $Z_{01}$ to $Z_{02}$. The impedance matching circuit 222 is configured to implement matching from $Z_{02}$ to $Z_{03}$, ..., and the impedance matching circuit 22(N−1) is configured to implement matching from $Z_{0n-1}$ to 50 ohm. 50 is an example for description, which is not a limitation in this embodiment of this application.

In some embodiments, a characteristic impedance of each of the N−1 couplers is determined based on optimal impedances of power transistors of the first power amplifier branch and the second power amplifier branches that operate in the class B (B) operating mode. That is, a characteristic impedance of each of the couplers can be optimized based on the optimal impedances of the power transistors of the first power amplifier branch and the second power amplifier branches that operate in the class B operating mode, to achieve optimal matching and full performance of the power amplifier circuit in this embodiment of this application.

For example, a characteristic impedance of the coupler 211 is determined based on optimal impedances of power transistors of the power amplifier branch 11 and the power amplifier branch 12 that operate in the class B (B) operating mode. For example, an optimal impedance may be determined by using the following formula (1):

$$Ropt = 0.5 \times (Vdd - Vknee)^2 / Psat \quad (1)$$

Ropt is an optimal impedance, Vdd is a drain bias voltage, Vknee is a knee voltage of a power transistor, and Psat is a saturated output power of the power transistor.

In some embodiments, any one of the foregoing impedance matching circuits may be at least one of a low-pass filter circuit, a high-pass filter circuit, a resonant circuit, or a microstrip line.

In this embodiment, a characteristic impedance of a coupler in the combiner circuit can be determined based on an optimal impedance of a power transistor of a power amplifier branch, which can improve performance of the power amplifier circuit of this application.

The power amplifier circuit of the embodiments of this application is described below by using an example that N=3.

Figure 4:
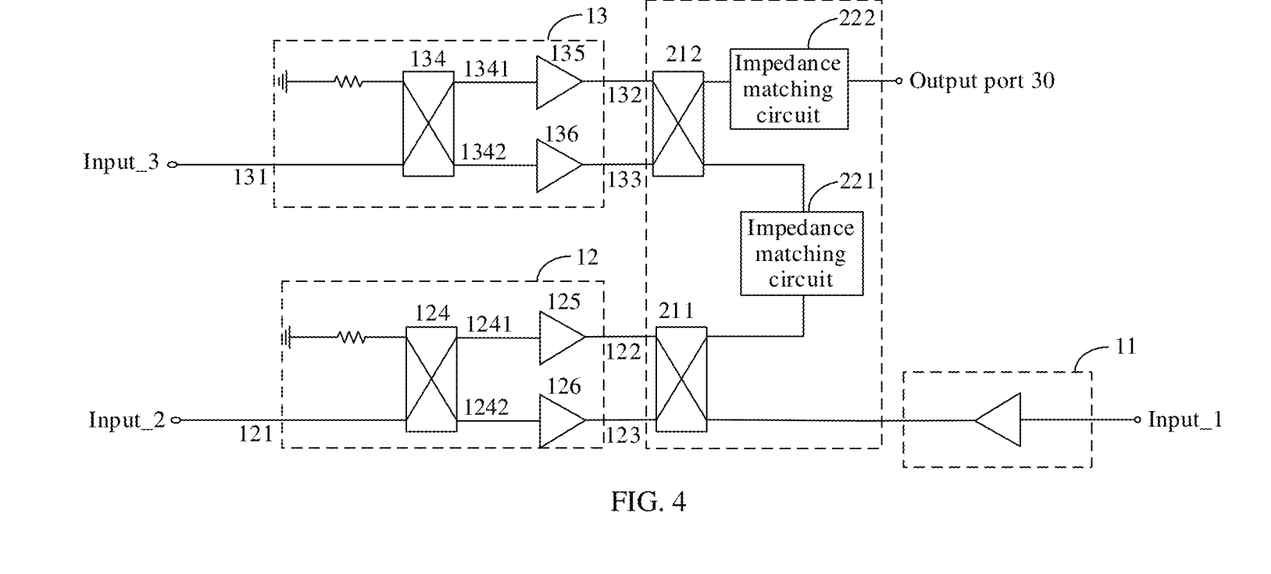
FIG. 4 is a schematic diagram of a structure of another power amplifier circuit according to an embodiment of this application.

FIG. 4 is a schematic diagram of a structure of another power amplifier circuit according to an embodiment of this application. As shown in FIG. 4, the power amplifier circuit includes three (N=3) input ports, three power amplifier branches, one combiner circuit, and one output port.

The three input ports are input_1, input_2, input_3, and input_3. The three power amplifier branches are a power amplifier branch 11, a power amplifier branch 12, and a power amplifier branch 13. The first power amplifier branch 11 is a power amplifier, that is, used as a main amplifier. The power amplifier branch 12 includes a power allocation circuit 124, a power amplifier sub-branch 125, and a power amplifier sub-branch 126, where the power allocation circuit 124 is a coupler, the coupler is configured to perform power allocation, the power amplifier sub-branch 125 and the power amplifier sub-branch 126 are power amplifiers with a same gate bias voltage, and the two power amplifiers may be used as two peaking amplifiers 1. The power amplifier sub-branch 125 and the power amplifier sub-branch 126 are connected to a coupler 211, an output port of the coupler 211 is connected to an impedance matching circuit 221, and an output port of the impedance matching circuit 221 is connected to an isolated port of a coupler 212. The power amplifier branch 13 includes a power allocation circuit 134, a power amplifier sub-branch 135, and a power amplifier sub-branch 136, where the power allocation circuit 134 is a coupler, the coupler is configured to perform power allocation, the power amplifier sub-branch 135 and the power amplifier sub-branch 136 are power amplifiers with a same gate bias voltage, and the two power amplifiers may be used as two peaking amplifiers 2. The power amplifier sub-branch 135 and the power amplifier sub-branch 136 are connected to the coupler 212, an output port of the coupler 212 is connected to an impedance matching circuit 222, and an output port of the impedance matching circuit 222 is connected to the output port.

Characteristic impedances of the power allocation circuit 124 and the power allocation circuit 134 may be 50 ohms, a characteristic impedance of the coupler 211 is $Z_{01}$, and a characteristic impedance of the coupler 212 is $Z_{02}$.

When there is a low power, the main amplifier operates in the class AB/B, and the main amplifier operates until saturated. After the main amplifier is saturated, the peaking amplifiers 1 are turned on, and the peaking amplifiers 2 are still off. The main amplifier remains saturated, until the peaking amplifiers 1 are saturated. After the peaking amplifiers 1 are saturated, the peaking amplifiers 2 are turned on, and the main amplifier and the peaking amplifiers 1 remain saturated, until the main amplifier, the peaking amplifiers 1, and the peaking amplifiers 2 are saturated.

Because of the foregoing connection relationship, there is no load pull between the main amplifier and the peaking amplifiers 1, and there is no load pull between the main amplifier and the peaking amplifiers 1 and the peaking amplifiers 2.

The main amplifier reaches current saturation at a first high efficiency point, and a load pull ratio LPR is equal to 1. The peaking amplifiers 1 reach current saturation at a second high efficiency point, and a load pull ratio LPR is equal to 1. A third high efficiency point appears at a location at full power, where the peaking amplifiers 2 reach current saturation. The high efficiency points appear at full power 0 dB, BO1 dB, and BO2 dB respectively. BO1 and BO2 may be calculated by using the following formula, where Psat_Main:Psat_Peak1:Psat_Peak2=1:0.8:2.2:

$$BO1 = \log_{10}((\text{Psat\_Main} + 2 \times \text{Psat\_Peak1})/(\text{Psat\_Main} +$$
$$2 \times \text{Psat\_Peak1} + 2 \times \text{Psat\_Peak2})) \approx -4.3 \text{ dB}$$

$$BO2 = \log_{10}(\text{Psat\_Main}/(\text{Psat\_Main} +$$
$$2 \times \text{Psat\_Peak1} + 2 \times \text{Psat\_Peak2})) \approx -8.45 \text{ dB}$$

Psat_Main represents a saturation output power of the main amplifier, Psat_Peak1 represents a saturation output power of the peaking amplifiers 1, and Psat_Peak2 represents a saturation output power of the peaking amplifiers 2.

The three power amplifier branches of the power amplifier circuit in this embodiment of this application, compared with a three-way Doherty, can achieve a load pull ratio of 1 under a same power back-off, and can fully extend an operating bandwidth of the power amplifier circuit. The operating bandwidth of the power amplifier circuit in this embodiment of this application depends on an operating bandwidth of a power transistor and an operating bandwidth of a coupler.

Figure 5:
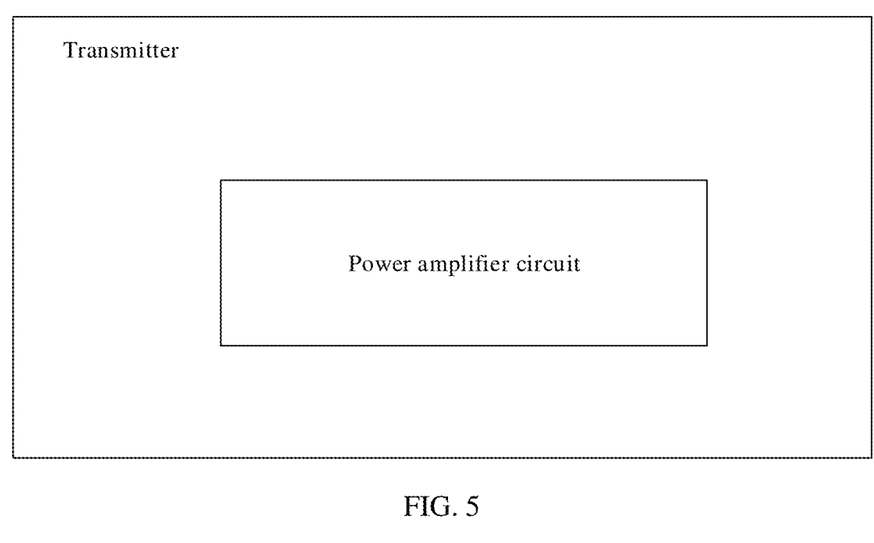
FIG. 5 is a schematic diagram of a structure of a transmitter according to an embodiment of this application.

FIG. 5 is a schematic diagram of a structure of a transmitter according to an embodiment of this application. As shown in FIG. 5, the transmitter may include the power amplifier circuit in any of the embodiments of FIG. 1 to FIG. 4 of this application.

For the implementation principle and technical effects, refer to the descriptions in the foregoing embodiments. Details are not described herein again.

Figure 6:
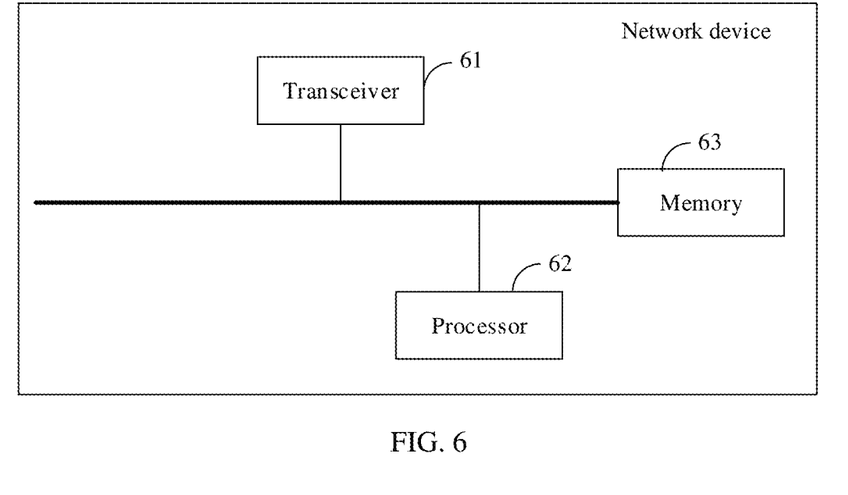
FIG. 6 is a schematic diagram of a structure of a network device according to an embodiment of this application.

FIG. 6 is a schematic diagram of a structure of a network device according to an embodiment of this application. As shown in FIG. 6, the network device may include a transceiver 61, a processor 62, and a memory 63, where the transceiver may include the power amplifier circuit in any of the embodiments of FIG. 1 to FIG. 4 of this application. For the implementation principle and technical effects, refer to the descriptions in the foregoing embodiments. Details are not described herein again.

The processor mentioned in the embodiments of this application may be a central processing unit (Central Processing Unit, CPU), the processor may further be another general-purpose processor, a digital signal processor (Digital Signal Processor, DSP), an application specific integrated circuit (Application-Specific Integrated Circuit, ASIC), a field programmable gate array (Field Programmable Gate Array, FPGA), or another programmable logic device, discrete gate or transistor logic device, discrete hardware component, or the like. The general-purpose processor may be a microprocessor, or the processor may be any conventional processor, or the like.

The memory mentioned in the embodiments of this application may be a volatile memory or a nonvolatile memory, or may include a volatile memory and a nonvolatile memory. The nonvolatile memory may be a read-only memory (Read-Only Memory, ROM), a programmable read-only memory (Programmable ROM, PROM), an erasable programmable read-only memory (Erasable PROM, EPROM), an electrically erasable programmable read-only memory (Electrically EPROM, EEPROM), or a flash memory. The volatile memory may be a random-access memory (Random Access Memory, RAM), used as an external cache. Through example but not limitative description, many forms of RAMs may be used, for example, a static random access memory (Static RAM, SRAM), a dynamic random access memory (Dynamic RAM, DRAM), a synchronous dynamic random access memory (Synchronous DRAM, SDRAM), a double data rate synchronous dynamic random access memory (Double Data Rate SDRAM, DDR SDRAM), an enhanced synchronous dynamic random access memory (Enhanced SDRAM, ESDRAM), a synchlink dynamic random access memory (Synchlink DRAM, SLDRAM), and a direct rambus random access memory (Direct Rambus RAM, DR RAM).

When the processor is a general-purpose processor, a DSP, an ASIC, an FPGA or another programmable logic device, a discrete gate, a transistor logic device, or a discrete hardware component, the memory (a storage module) is integrated into the processor.

The memory described in this specification is intended to include but is not limited to these memories and any other appropriate types of memories.

The foregoing descriptions are implementations of this application but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A power amplifier circuit, wherein the power amplifier circuit comprises:
   N input ports, N power amplifier branches, one combiner circuit, and one output port, wherein
   each of the N input ports is connected to a corresponding power amplifier branch in the N power amplifier branches, each of the N power amplifier branches is connected to the combiner circuit, and the combiner circuit is further connected to the output port;
   each of the N input ports is configured to input a corresponding input signal;
   the N power amplifier branches and the combiner circuit are configured to perform power amplification and combining on N input signals, to generate an output signal; and
   the output port is configured to output the output signal, wherein
   the N power amplifier branches comprise one first power amplifier branch and N−1 second power amplifier branches, the first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2;
   wherein the combiner circuit comprises N−1 couplers and N−1 impedance matching circuits;
   a first impedance matching circuit of the N−1 impedance matching circuits is between two adjacent couplers of the N−1 couplers, and a second impedance matching circuit of the N−1 impedance matching circuits is between the output port and a coupler of the N−1 couplers; and
   an isolated port of a first coupler of the N−1 couplers is connected to an output of the first power amplifier branch, and two balance ports of each of the N−1 couplers each are connected to a corresponding one of the N−1 second power amplifier branches.

2. The power amplifier circuit according to claim 1, wherein each of the N−1 second power amplifier branches comprises one first port and two second ports, the first port is connected to one input port of the N input ports, and the two second ports are separately connected to the combiner circuit; and
   each of the N−1 second power amplifier branches is configured to perform power allocation and power amplification on a corresponding one of the input signals, to generate two second signals, and each of the two second signals is output to the combiner circuit through one of the second ports, wherein
   amplitudes of the two second signals are the same, and a phase difference of the two second signals is 90 degrees.

3. The power amplifier circuit according to claim 2, wherein each of the N−1 second power amplifier branches comprises one power allocation circuit and two power amplifier sub-branches; and
   a through port and a coupling port of the power allocation circuit each are connected to one of the power amplifier sub-branches, wherein
   the two power amplifier sub-branches operate in a class C operating mode with a same bias.

4. The power amplifier circuit according to claim 1, wherein the first impedance matching circuit between the two adjacent couplers is configured to convert a characteristic impedance of a former coupler in the two adjacent couplers to a characteristic impedance of a latter coupler in the two adjacent couplers.

5. The power amplifier circuit according to claim 4, wherein a characteristic impedance of each of the N−1 couplers is determined based on optimal impedances of power transistors of the first power amplifier branch and the second power amplifier branches that operate in the class B operating mode.

6. The power amplifier circuit according to claim 1, wherein the first impedance matching circuit comprises at least one of a low-pass filter circuit, a high-pass filter circuit, a resonant circuit, or a microstrip line.

7. The power amplifier circuit according to claim 1, wherein the first power amplifier branch comprises a power amplifier.

8. The power amplifier circuit according to claim 1, wherein the first power amplifier branch comprises a Doherty circuit, an input port of the Doherty circuit is connected to an input port of the power amplifier circuit, and an output port of the Doherty circuit is connected to the combiner circuit.

9. The power amplifier circuit according to claim 1, wherein the first power amplifier branch reaches a state of voltage saturation and current saturation before the second power amplifier branches reach a state of voltage saturation and current saturation.

10. A transmitter, comprising a power amplifier circuit, wherein the power amplifier circuit comprises:
    N input ports, N power amplifier branches, one combiner circuit, and one output port, wherein
    each of the N input ports is connected to a corresponding power amplifier branch in the N power amplifier branches, each of the N power amplifier branches is connected to the combiner circuit, and the combiner circuit is further connected to the output port;
    each of the N input ports is configured to input a corresponding input signal;

the N power amplifier branches and the combiner circuit are configured to perform power amplification and combining on N input signals, to generate an output signal; and the output port is configured to output the output signal, wherein the N power amplifier branches comprise one first power amplifier branch and N−1 second power amplifier branches, the first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2, wherein the combiner circuit comprises N−1 couplers and N−1 impedance matching circuits;

a first impedance matching circuit of the N−1 impedance matching circuits is between two adjacent couplers of the N−1 couplers, and a second impedance matching circuit of the N−1 impedance matching circuits is between the output port and one coupler of the N−1 couplers; and an isolated port of a first coupler of the N−1 couplers is connected to an output of the first power amplifier branch, and two balance ports of each of the N−1 couplers each are connected to a corresponding one of the N−1 second power amplifier branches.

11. The transmitter according to claim 10, wherein each of the N−1 second power amplifier branches comprises one first port and two second ports, the first port is connected to one input port of the N input ports, and the two second ports are separately connected to the combiner circuit; and each of the N−1 second power amplifier branches is configured to perform power allocation and power amplification on a corresponding one of the input signals, to generate two second signals, and each of the two second signals is output to the combiner circuit through one of the second ports, wherein amplitudes of the two second signals are the same, and a phase difference of the two second signals is 90 degrees.

12. The transmitter according to claim 11, wherein each of the N−1 second power amplifier branches comprises one power allocation circuit and two power amplifier sub-branches; and a through port and a coupling port of the power allocation circuit each are connected to one of the power amplifier sub-branches, wherein the two power amplifier sub-branches operate in a class C operating mode with a same bias.

13. The transmitter according to claim 10, wherein the impedance matching circuit between the two adjacent couplers is configured to convert a characteristic impedance of a former coupler in the two adjacent couplers to a characteristic impedance of a latter coupler in the two adjacent couplers.

14. The transmitter according to claim 13, wherein a characteristic impedance of each of the N−1 couplers is determined based on optimal impedances of power transistors of the first power amplifier branch and the second power amplifier branches that operate in the class B operating mode.

15. A network device, wherein the network device comprises a transceiver, a processor, and a memory, and a transceiver comprises a power amplifier circuit, wherein the power amplifier circuit comprises:

N input ports, N power amplifier branches, one combiner circuit, and one output port, wherein each of the N input ports is connected to a corresponding power amplifier branch in the N power amplifier branches, each of the N power amplifier branches is connected to the combiner circuit, and the combiner circuit is further connected to the output port;

each of the input ports is configured to input a corresponding input signal;

the N power amplifier branches and the combiner circuit are configured to perform power amplification and combining on N input signals, to generate an output signal; and the output port is configured to output the output signal, wherein the N power amplifier branches comprise one first power amplifier branch and N−1 second power amplifier branches, the first power amplifier branch operates in a class AB or class B operating mode, the N−1 second power amplifier branches operate in a class C operating mode with different gate bias voltages, the gate bias voltages of the N−1 second power amplifier branches become lower in order, and N is a positive integer greater than 2; wherein the combiner circuit comprises N−1 couplers and N−1 impedance matching circuits;

a first impedance matching circuit of the N−1 impedance matching circuits is between two adjacent couplers of the N−1 couplers, and a second impedance matching circuit of the N−1 impedance matching circuits is between the output port and one coupler of the N−1 couplers; and an isolated port of a first coupler of the N−1 couplers is connected to an output of the first power amplifier branch, and two balance ports of each of the N−1 couplers each are connected to a corresponding one of the N−1 second power amplifier branches.

16. The network device according to claim 15, wherein each of the N−1 second power amplifier branches comprises one first port and two second ports, the first port is connected to one input port of the N input ports, and the two second ports are separately connected to the combiner circuit; and each of the N−1 second power amplifier branches is configured to perform power allocation and power amplification on a corresponding one of the input signals, to generate two second signals, and each of the two second signals is output to the combiner circuit through one of the second ports, wherein amplitudes of the two second signals are the same, and a phase difference of the two second signals is 90 degrees.

17. The network device according to claim 16, wherein each of the N−1 second power amplifier branches comprises one power allocation circuit and two power amplifier sub-branches; and a through port and a coupling port of the power allocation circuit each are connected to one of the power amplifier sub-branches, wherein the two power amplifier sub-branches operate in a class C operating mode with a same bias.

18. The network device according to claim 15, wherein the first impedance matching circuit between the two adjacent couplers is configured to convert a characteristic impedance of a former coupler in the two adjacent couplers to a characteristic impedance of a latter coupler in the two adjacent couplers.

19. The network according to claim 18, wherein a characteristic impedance of each of the N−1 couplers is determined based on optimal impedances of power transistors of the first power amplifier branch and the second power amplifier branches that operate in the class B operating mode.

20. The network according to claim 15, wherein the first impedance matching circuit comprises at least one of a low-pass filter circuit, a high-pass filter circuit, a resonant circuit, or a microstrip line.

* * * * *